US012641880B2

(12) United States Patent
Yi et al.

(10) Patent No.: US 12,641,880 B2
(45) Date of Patent: May 26, 2026

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventors: Shijuan Yi, Wuhan (CN); Liang Sun, Wuhan (CN); Likun Cheng, Wuhan (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 749 days.

(21) Appl. No.: 17/280,888

(22) PCT Filed: Dec. 30, 2020

(86) PCT No.: PCT/CN2020/141753
§ 371 (c)(1),
(2) Date: Sep. 26, 2023

(87) PCT Pub. No.: WO2022/141280
PCT Pub. Date: Jul. 7, 2022

(65) Prior Publication Data
US 2024/0040690 A1 Feb. 1, 2024

(30) Foreign Application Priority Data
Dec. 29, 2020 (CN) .......................... 202011589146.6

(51) Int. Cl.
*H10D 86/40* (2025.01)
*H10D 86/60* (2025.01)
(Continued)

(52) U.S. Cl.
CPC ........... *H10D 86/441* (2025.01); *H10D 86/60* (2025.01); *H10K 59/121* (2023.02);
(Continued)

(58) Field of Classification Search
CPC ............... H05K 1/0283; H05K 1/0298; H05K 2201/09245; H05K 2201/10128;
(Continued)

(56) References Cited

U.S. PATENT DOCUMENTS

2016/0268352 A1* 9/2016 Hong .................... H10K 59/121
2018/0052493 A1 2/2018 Hong et al.
(Continued)

FOREIGN PATENT DOCUMENTS

CN 107994052 A 5/2018
CN 110246868 A 9/2019
(Continued)

OTHER PUBLICATIONS

Chinese Office Action issued in corresponding Chinese Patent Application No. 202011589146.6 dated Mar. 16, 2022, pp. 1-7.
(Continued)

*Primary Examiner* — Steven T Sawyer
(74) *Attorney, Agent, or Firm* — PV IP PC; Peter Stecher; Wei Te Chung

(57) ABSTRACT

The present application discloses a display panel and a display device, including a plurality of pixel islands, a plurality of connection bridges connecting the plurality of pixel islands, and first power lines and second power line arranged on the plurality of connection bridges and conducting the plurality of pixel islands, wherein the plurality of connection bridges include first connection bridges arranged along a first direction, and only the first power line or the second power line is provided on each of the first connection bridges.

16 Claims, 11 Drawing Sheets

(51) Int. Cl.

| | |
|---|---|
| *H10K 59/121* | (2023.01) |
| *H10K 59/131* | (2023.01) |
| *H05K 1/02* | (2006.01) |

(52) U.S. Cl.
CPC ......... *H10K 59/131* (2023.02); *H05K 1/0298* (2013.01); *H05K 2201/09245* (2013.01); *H05K 2201/10128* (2013.01)

(58) Field of Classification Search
CPC .... H10D 86/441; H10D 86/411; H10D 86/60; G09G 3/035; G09G 3/32; G09G 2300/0426; G09G 2330/00; H10K 59/131; H10K 59/122; H10K 59/1315; G09F 9/30
See application file for complete search history.

(56) References Cited

U.S. PATENT DOCUMENTS

| | | | | |
|---|---|---|---|---|
| 2018/0061854 | A1* | 3/2018 | Ono ..................... | G09G 3/3696 |
| 2018/0114825 | A1* | 4/2018 | Hong .................... | H10K 59/38 |
| 2018/0358418 | A1 | 12/2018 | Hong et al. | |
| 2020/0388666 | A1* | 12/2020 | Park ..................... | H10K 77/111 |
| 2021/0005700 | A1* | 1/2021 | Park ..................... | H10K 50/844 |
| 2021/0057659 | A1* | 2/2021 | Sun ..................... | H10K 59/131 |

FOREIGN PATENT DOCUMENTS

| | | |
|---|---|---|
| CN | 110459571 A | 11/2019 |
| CN | 111210726 A | 5/2020 |
| CN | 111341813 A | 6/2020 |
| CN | 111710242 A | 9/2020 |
| CN | 111799280 A | 10/2020 |
| CN | 112086470 A | 12/2020 |

OTHER PUBLICATIONS

International Search Report in International application No. PCT/CN2020/141753, mailed on Sep. 28, 2021.
Written Opinion of the International Searching Authority in International application No. PCT/CN2020/141753, mailed on Sep. 28, 2021.

* cited by examiner

DISPLAY PANEL AND DISPLAY DEVICE

RELATED APPLICATIONS

This application is a Notional Phase of PCT Patent Application No. PCT/CN2020/141753 having international filing date of Dec. 30, 2020, which claims the benefit of priority of Chinese Patent Application Nos. 202011589146.6 filed on Dec. 29, 2020. The contents of the above applications are all incorporated by reference as if fully set forth herein in their entirety.

FIELD OF INVENTION

The present application relates to the field of display technology, and in particular, to a display panel and a display device including the display panel.

DESCRIPTION OF PRIOR ART

Stretchable display, as an important technical upgrade of flexible display after foldable display, has an ability to be deformed and retractable in any direction. It can effectively solve the existing technical problems of 4 curved surfaces, non-Gaussian curved surfaces, and bending of a display surface, thus having a wide range of application prospects.

In the existing stretchable display panel, in order to facilitate the tensile resilience, the substrate is dispersed in a shape of islands, and the islands are connected to each other by ribbon-shaped connection areas, wherein the pixel circuits are distributed on the islands, and the connection wires between the pixel circuits are distributed on the ribbon-shaped connection area.

However, when the display panel is stretched and deformed, the connection area will be deformed under force, and the resilience resistance of the connection area is inversely proportional to its width. Currently, there are many signal lines in the connection areas, including two power signal lines, namely a VDD power line and a VSS power line, and due to a large current of the power lines, they have a wider line width, resulting in a wider connection area, which is not conducive to the stretching and deformation of the connection area, and then impacting the stretching and bending performance.

SUMMARY OF INVENTION

Technical Problem

Embodiments of the present application provide a display panel and a display device, which can solve the problem that in the prior art, due to the large number of signal lines provided in the connection area, the connection area is wider, which is not conducive to the stretching and deformation of the connection area, thereby impacting the display. Technical issues of the tensile and bending properties of the panel.

Technical Solution

In order to solve the above technical problems, the present application provides a display panel, which includes:
    a plurality of pixel islands arranged along a first direction and a second direction which intersect each other;
    a plurality of connection bridges, including first connection bridges connecting adjacent ones of the pixel islands arranged along the first direction; and a signal line group disposed on the plurality of connection bridges, wherein the signal line group includes a first power line and a second power line, only the first power line or the second power line is provided on each of the first connection bridges, and the first power line or the second power line is connected to adjacent ones of the pixel islands arranged along the first direction.

In an embodiment of the present application, one of the first connection bridges provided with only the first power line and one of the first connection bridges provided with only the second power line are alternately arranged in the first direction.

In an embodiment of the present application, ones of the first connection bridges provided with only the first power line and ones of the first connection bridges provided with only the second power line are alternately arranged in the second direction.

In an embodiment of the present application, two of the first connection bridges provided with only the first power line and two of the first connection bridges provided with only the second power line are alternately arranged in the second direction.

In an embodiment of the present application, the plurality of connection bridges further include second connection bridges connecting adjacent ones of the pixel islands arranged along the second direction, and the first power line and the second power line are provided on each of the second connection bridges to connect adjacent ones of the pixel islands arranged along the second direction.

In an embodiment of the present application, the first power line located on one of the first connection bridges is connected to the first power line located on one of the second connection bridges to form a first grid structure, and the second power line located on one of the first connection bridges is connected to the second power line located on one of the second connection bridges to form a second grid structure.

In an embodiment of the present application, the first power line and the second power line intersect each other on part of the plurality of pixel islands, and a grid of the first grid structure corresponding to the intersecting first power line and a grid of the second grid structure corresponding to the intersecting second power line have an overlapping portion.

In an embodiment of the present application, the signal line group further includes a reset signal line, a light-emitting control signal line, a data line, and a scan line; and
    wherein the reset signal line, the light-emitting control signal line, and the scan line are provided on the first connection bridges to connect adjacent ones of the pixel islands arranged along the first direction, and the data line is disposed on the second connection bridges to connect adjacent ones of the pixel islands arranged along the second direction.

In an embodiment of the present application, each of the plurality of connection bridges includes a substrate, and a first conductive layer, an insulating layer, and a second conductive layer sequentially disposed on the substrate, the first power line, the second power line, and the reset signal line are disposed in the second conductive layer; and the light-emitting control signal line, the data line, and the scan line are disposed in the first conductive layer.

In an embodiment of the present application, the first power line includes a VDD power supply signal line, and the second power line includes a VSS power supply signal line.

According to the above object of the present application, a display device is provided, the display device includes a display panel, and the display panel includes:

a plurality of pixel islands arranged along a first direction and a second direction which intersect each other;

a plurality of connection bridges, including first connection bridges connecting adjacent ones of the pixel islands arranged along the first direction; and a signal line group disposed on the plurality of connection bridges, wherein the signal line group includes a first power line and a second power line, only the first power line or the second power line is provided on each of the first connection bridges, and the first power line or the second power line is connected to adjacent ones of the pixel islands arranged along the first direction.

In an embodiment of the present application, one of the first connection bridges provided with only the first power line and one of the first connection bridges provided with only the second power line are alternately arranged in the first direction.

In an embodiment of the present application, ones of the first connection bridges provided with only the first power line and ones of the first connection bridges provided with only the second power line are alternately arranged in the second direction.

In an embodiment of the present application, two of the first connection bridges provided with only the first power line and two of the first connection bridges provided with only the second power line are alternately arranged in the second direction.

In an embodiment of the present application, the plurality of connection bridges further include second connection bridges connecting adjacent ones of the pixel islands arranged along the second direction, and the first power line and the second power line are provided on each of the second connection bridges to connect adjacent ones of the pixel islands arranged along the second direction.

In an embodiment of the present application, the first power line located on one of the first connection bridges is connected to the first power line located on one of the second connection bridges to form a first grid structure, and the second power line located on one of the first connection bridges is connected to the second power line located on one of the second connection bridges to form a second grid structure.

In an embodiment of the present application, the first power line and the second power line intersect each other on part of the plurality of pixel islands, and a grid of the first grid structure corresponding to the intersecting first power line and a grid of the second grid structure corresponding to the intersecting second power line have an overlapping portion.

In an embodiment of the present application, the signal line group further includes a reset signal line, a light-emitting control signal line, a data line, and a scan line; and wherein the reset signal line, the light-emitting control signal line, and the scan line are provided on the first connection bridges to connect adjacent ones of the pixel islands arranged along the first direction, and the data line is disposed on the second connection bridges to connect adjacent ones of the pixel islands arranged along the second direction.

In an embodiment of the present application, each of the plurality of connection bridges includes a substrate, and a first conductive layer, an insulating layer, and a second conductive layer sequentially disposed on the substrate, the first power line, the second power line, and the reset signal line are disposed in the second conductive layer; and the light-emitting control signal line, the data line, and the scan line are disposed in the first conductive layer.

In an embodiment of the present application, the first power line includes a VDD power supply signal line, and the second power line includes a VSS power supply signal line.

Advantageous Effect

Compared with the prior art, in the present application, only the first power line or the second power line is provided on each of the first connection bridges, thereby reducing a number of power lines on the first connection bridge, and since each of the power lines has a large current and a wide line width, the present application can greatly reduce a width of the first connection bridge, improve the stretchability of the connection bridge, and elevate the stretching and bending performance of the display panel.

BRIEF DESCRIPTION OF DRAWINGS

The following detailed description of specific implementations of the present application in conjunction with the accompanying drawings will make the technical solutions and other beneficial effects of the present application obvious.

DETAILED DESCRIPTION OF PREFERRED EMBODIMENTS

Figure 1A:
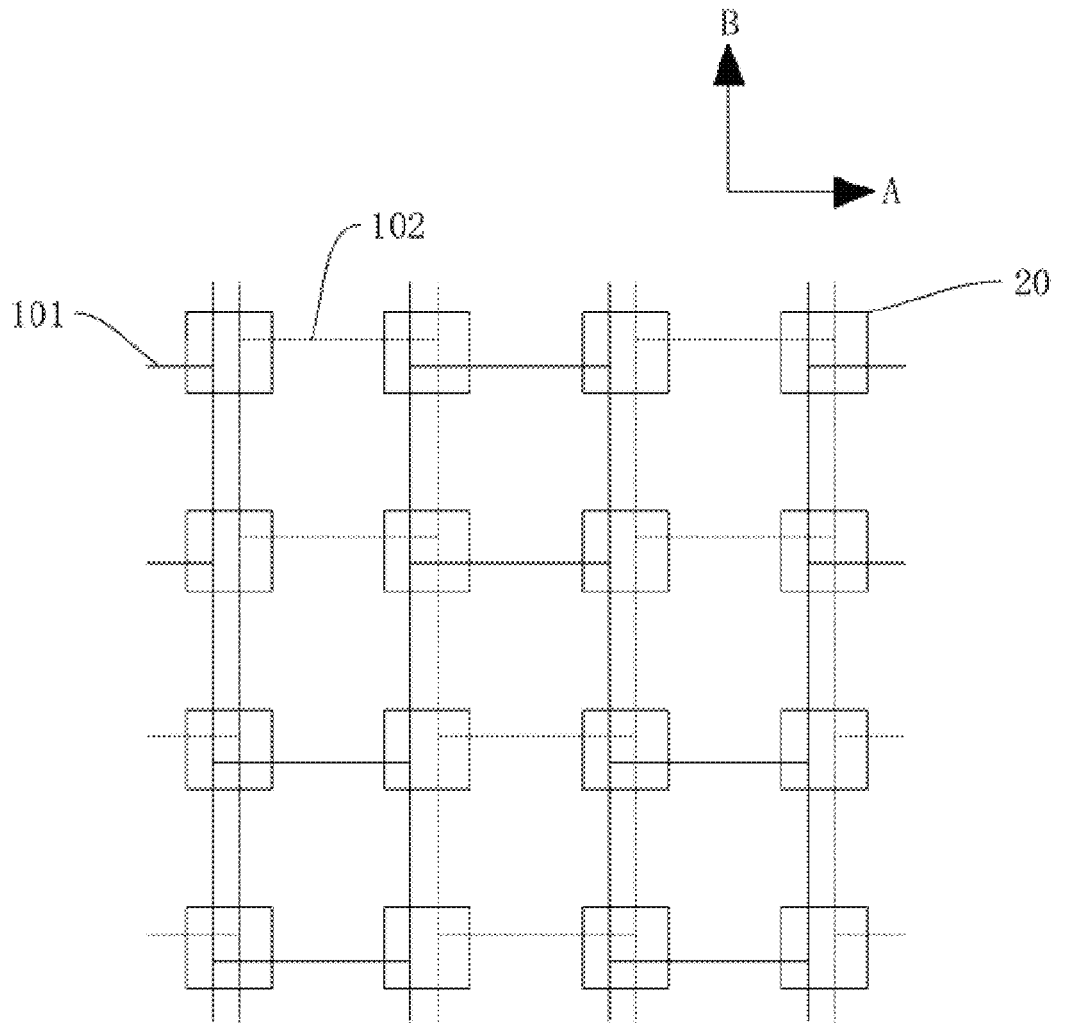
FIG. 1A is a schematic diagram of a power line grid structure in a display panel provided by an embodiment of the present application.

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

In the description of the present application, it should be understood that the terms "center", "longitudinal", "transverse", "length", "width", "thickness", "upper", "lower", "front", "Rear", "left", "right", "vertical", "horizontal", "top", "bottom", "inside", "outside", "clockwise", "counterclockwise", and the like are based on the orientation or positional relationship shown in the drawings, and is merely for the convenience of describing the present invention and simplifying the description, rather than indicating or implying that the device or element referred to must have a specific orientation, structure and operation in a specific orientation, which should not be construed as limitations on the present invention. In addition, the terms "first" and "second" are used for descriptive purposes only, and cannot be understood as indicating or implying relative importance or implicitly indicating the number of technical features indicated. Therefore, the features defined as "first" and "second" may explicitly or implicitly include one or more of the features. In the description of the present application, the meaning of "a plurality" is two or more, unless specifically defined otherwise.

In the description of the present application, it should be noted that the terms "installation", "connected", and "connected" should be understood in a broad sense unless explicitly stated and limited otherwise. For example, it can be a fixed connection, a detachable connection, or an integral connection; it can also be a mechanical connection or an electrical connection; it can be a direct connection; or it can be an indirect connection through an intermediate medium; or it can be a communication between two components.

In the present invention, unless otherwise expressly stated and limited, the formation of a first feature over or under a second feature in the description that follows may include embodiments in which the first and second features are formed in direct contact, and may also include embodiments in which additional features may be formed between the first and second features, such that the first and second features may not be in direct contact. Moreover, the first feature "above", "over" and "on" the second feature includes the first feature directly above and above the second feature, or merely indicating that the first feature is at a level higher than the second feature. The first feature "below", "under" and "beneath" the second feature includes the first feature directly below and obliquely below the second feature, or merely the first feature has a level lower than the second feature.

The following disclosure provides many different embodiments or examples for realizing different structures of the present application. To simplify the disclosure of the present application, the components and settings of specific examples are described below. Of course, they are only examples and are not intended to limit the present application. In addition, the present application may repeat reference numerals and/or reference letters in different examples. Such repetition is for the purpose of simplification and clarity, and does not indicate the relationship between the various embodiments and/or settings discussed. In addition, the present application provides examples of various specific processes and materials, but those of ordinary skill in the art may be aware of the present applications of other processes and/or the use of other materials.

The embodiments of the present application are directed to solve the technical problems in the existing display panel and display device, in which, due to a large number of signal lines provided in connection areas, the connection areas are wider, which is not conducive to the stretching and deformation of the connection areas, thereby impacting the stretching and bending performance of the display panel.

Figure 2:
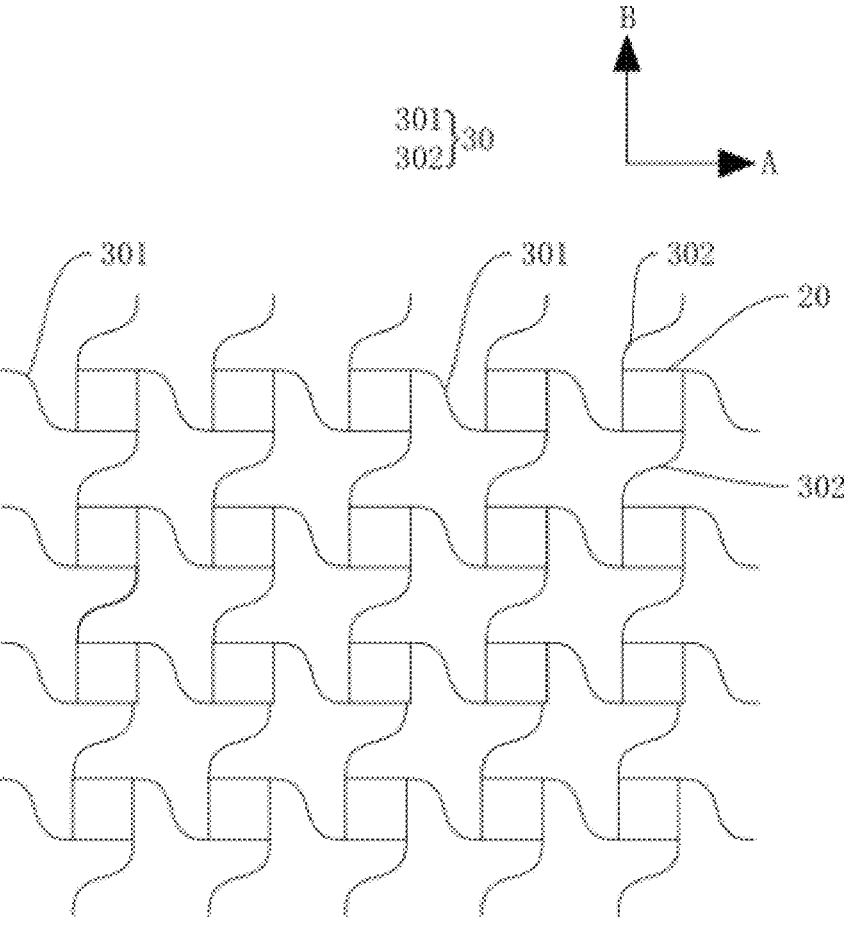
FIG. 2 is a schematic diagram of a connection structure between pixel islands and a connection bridge in a display panel provided by an embodiment of the present application.

In order to solve the above technical problems, the present application provides a display panel. Referring to FIG. 1A and FIG. 2. The display panel includes: a plurality of pixel islands 20 arranged along a first direction A and a second direction B that intersect each other; a plurality of connection bridges 30, including a first connection bridge 301 that connects adjacent ones of the pixel islands 20 arranged along the first direction A; and a signal line group disposed on the plurality of connection bridges 30, the signal line group includes a first power line 101 and a second power line 102, wherein only the first power line 101 or the second power lines 102 are provided on the first connection bridge 301, and the first power line 101 or the second power line 102 connects adjacent ones of the pixel islands 20 arranged along the first direction A.

Figure 5:
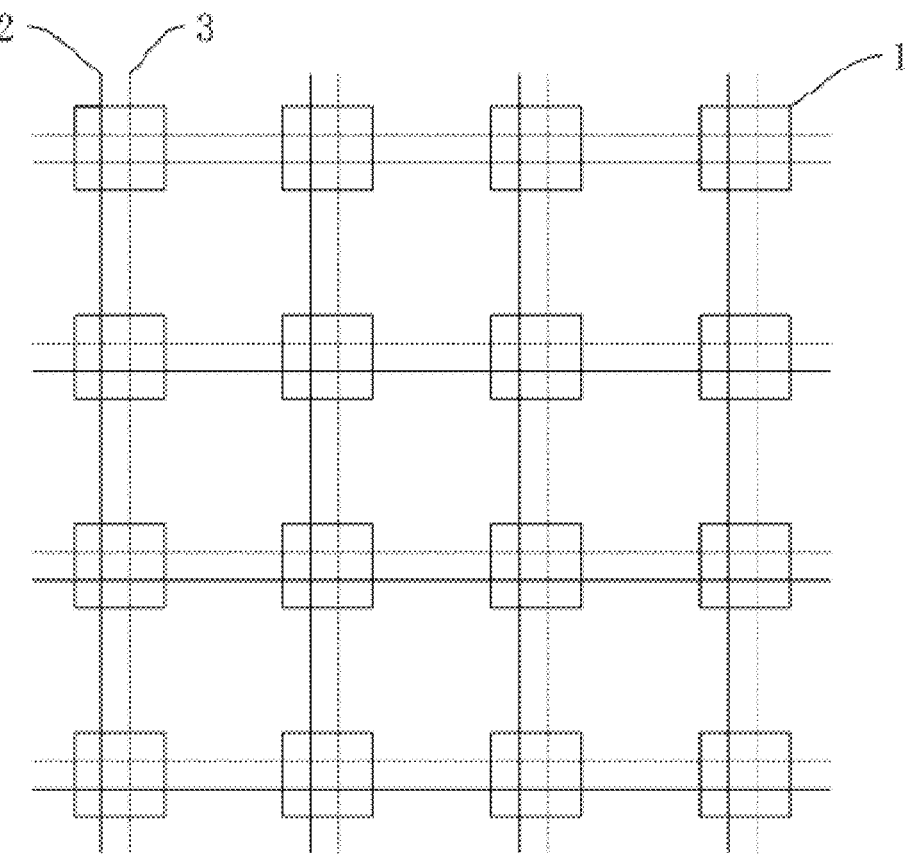
FIG. 5 is a schematic diagram of a power line grid structure in a conventional display panel.
Figure 7:
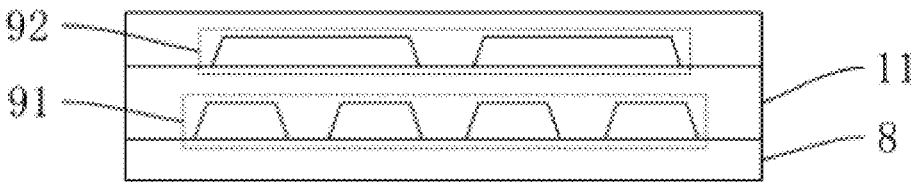
FIG. 7 is a schematic diagram of a cross-sectional structure of an existing connection bridge.

In the implementation process, referring to FIG. 5 and FIG. 7. In the existing stretchable display panel, at least VDD power line 2 and VSS power line 3 are provided on the connection bridge (not shown) connecting the adjacent pixel islands 1, and at least two power lines are provided on the connection bridge along the row direction and the column direction. In the prior art, in order to reduce the width of the connection bridge, the wiring structure design shown in FIG. 7 is adopted, in which the signal lines are divided into upper and lower layers, including a lower signal line 91 arranged on a substrate 8, an insulating layer 11 covering the lower signal line 91, an upper signal line 92 arranged on the insulating layer 11, and a functional layer 2 arranged on the upper signal line 92. However, because there are more signal lines, even if it is arranged in two layers, the effect is limited. In the display panel provided by the embodiment of the present application, by providing the power line grid structure shown in FIG. 1, the number of power lines on the first connection bridge 301 arranged along the first direction A is reduced by one. Moreover, because the current of the power line is relatively large, the line width is usually set to be relatively wide. Therefore, in an embodiment of the present application, by reducing one power line, the width of the first connection bridge 301 is reduced, thereby making the stretching and bending performance of the first connection bridge 301 improved, thus improving the stretching and bending performance of the display panel.

In an embodiment of the present application, only the first power line 101 or the second power lines 102 are provided on the first connection bridge 301 along the first direction A to realize the reduced width of the first connection bridge 301, thereby improving the bending and stretching performance of the display panel. Therefore, the arrangement of the signal line grid structure having the above-mentioned features provided by the embodiments of the present application falls into the scope of protection of the present application.

Furthermore, still referring to FIG. 1A and FIG. 2. As shown in FIG. 1A and FIG. 2, the display panel includes a plurality of pixel islands 20, and a plurality of connection bridges 30 connecting the plurality of pixel islands 20, and a signal line group 30 at least disposed on the plurality of connection bridges and connecting the plurality of pixel islands 20.

Specifically, the plurality of pixel islands 20 are arranged in rows and columns along a first direction A and a second direction B that intersect each other, and the connection bridges 30 include the first connection bridge 301 arranged along the first direction A and the second connection bridge 302 arranged along the second direction B, wherein the first connection bridge 301 connects adjacent ones of the pixel islands 20 arranged along the first direction A, and the second connection bridge 302 connects adjacent ones of the pixel islands 20 arranged along the second direction B.

The signal line group includes a first power line 101 and a second power line 102, the first connection bridge 301 is provided with only the first power line 101 or the second power line 102, the first power line 101 or the second power line 102 signally connects adjacent ones of the pixel islands 20 arranged along the first direction A, and the first power line 101 and the second power line 102 are arranged on the second connection bridge 302 along the second direction B, and signally connects adjacent ones of the pixel islands 20 arranged along the second direction B, that is, there are a plurality of second connection bridges 302 along the second direction B, and each of the second connection bridges 302 is provided with the first power line 101 and the second power line 102 thereon.

In an embodiment of the present application, one of the first connection bridges 301 provided with only the first power line 301 and one of the first connection bridges 301 provided with only the second power line 102 are alternately arranged in the first direction A, so that only one power line, namely the first power line 101 or the second power line 102, is provided on each of the first connection bridges 301.

In addition, ones of the first connection bridges 301 provided with only the first power line 101 and ones of the first connection bridges 301 provided with only the second power line 102 are alternately arranged in the second direction B, It should be noted that the first connection bridges 301 can be alternated regularly or irregularly in the second direction B, wherein, for regular alternation, one of the first connection bridges 301 provided with only the first power line 101 and one of the first connection bridges 301 provided with only the second power line 102 are alternately arranged in the second direction B; or two of the first connection bridges 301 provided with only the first power line 101 and two of the first connection bridges 301 provided with only the second power line 102 are alternately arranged in the second direction B; or three of the first connection bridges 301 provided with only the first power line 101 and three of the first connection bridges 301 provided with only the second power line 102 are alternately arranged in the second direction B; or alternately arranged in a stepwise decrease or increase manner. For example, the alternate arrangement in a stepwise increase manner includes from top to bottom: a first connection bridge 301 provided with only the first power line 101, and a s first connection bridge 301 provided with only the second power line 102, two first connection bridges 301 each provided with only the first power line 101, two first connection bridges 301 each provided with only the first power line 101. Alternatively, for irregular alternation, that is, the number of the first connection bridges 301 alternately repeated along the second direction B is irregular, but the present application is not particularly limited thereto.

The power line grid structure provided by embodiments of the present application will be described in detail below in conjunction with specific embodiments.

In an embodiment of the present application, referring to FIG. 1A and FIG. 2, two of the first connection bridges 301 each only provided with the first power line 101 and two of the first connection bridges 301 each only provided with the second power line 102 are alternately arranged in the second direction B. Specifically, every two of the first connection bridges 301 are arranged in pairs along the second direction B, and each of the first connection bridges 301 in each of the groups is provided with the first power line 101 or the second power line 102, that is, the first connection bridges 301 arranged along the second direction B in each of the pairs is provided with the same power line, which is the first power line 101 or the second power line 102. Moreover, the first power line 101 and the second power line 102 are respectively provided on adjacent two of the pairs of the first connection bridges 301, that is, the power lines provided on the adjacent two pairs of the first connection bridges 301 are different types, and the first power line 101 and the second power line 102 are alternately arranged.

In this embodiment, the first power line 101 located on the first connection bridge 301 is connected to the first power line 101 located on the second connection bridge 302 to form a first grid structure, and the second power line 102 on the first connection bridge 301 is connected to the second power line 102 on the second connection bridge 302 to form a second grid structure, that is, the first power lines 101 are signally connected to form the first grid structure with a grid, and the second power lines 102 are signally connected to form the second grid structure with a grid. Compared with the prior art in which the power lines are all set up one by one independently, in the embodiments of the present application, the power lines are connected to form a grid structure, which improves the uniformity of signal transmission, thereby reducing the in-plane pressure drop of the display panel.

Further, in this embodiment, on the second connection bridge 302, the first power line 101 and the second power line 102 are arranged in the same manner, as can be seen from FIG. 1A, the first power line 101 are arranged on the left side, and the second power line 102 are arranged on the right side, wherein the first power lines 101 and the second power lines 102 intersect on a part of the pixel islands 20, and does not intersect on another part of the pixel islands 20. Specifically, when the first power lines 101 and the second power lines 102 intersect on the pixel islands 20, the grid of the first grid structure corresponding to the intersecting first power lines 101 and the grid of the second grid structure corresponding to the intersecting second power lines 102 have an overlapping part.

In this embodiment, one of the pixel islands 20 having the first power line 101 and the second power line 102 that intersect each other, and the pixel islands 20 each having the first power line 101 and the second power line 102 that intersect and the pixel islands 20 each having the first power line 101 and the second power line 102 that do not intersect each other are alternately arranged in the first direction A; two of the pixel islands 20 each having the first power line 101 and the second power line 102 that intersect each other and two of the pixel islands 20 each having the first power line 101 and the second power line 102 that do not intersect each other are alternately arranged in the second direction B.

The power line grid structure provided in this embodiment improves the display uniformity of the display panel, so that the number of power lines arranged along the first direction A on the first connection bridge 301 is reduced by one, thereby reducing the width of the first connection bridge 301, and improving the stretching and bending performance of the first connection bridge 301, thus improving the stretching and bending performance of the display panel.

Figure 1B:
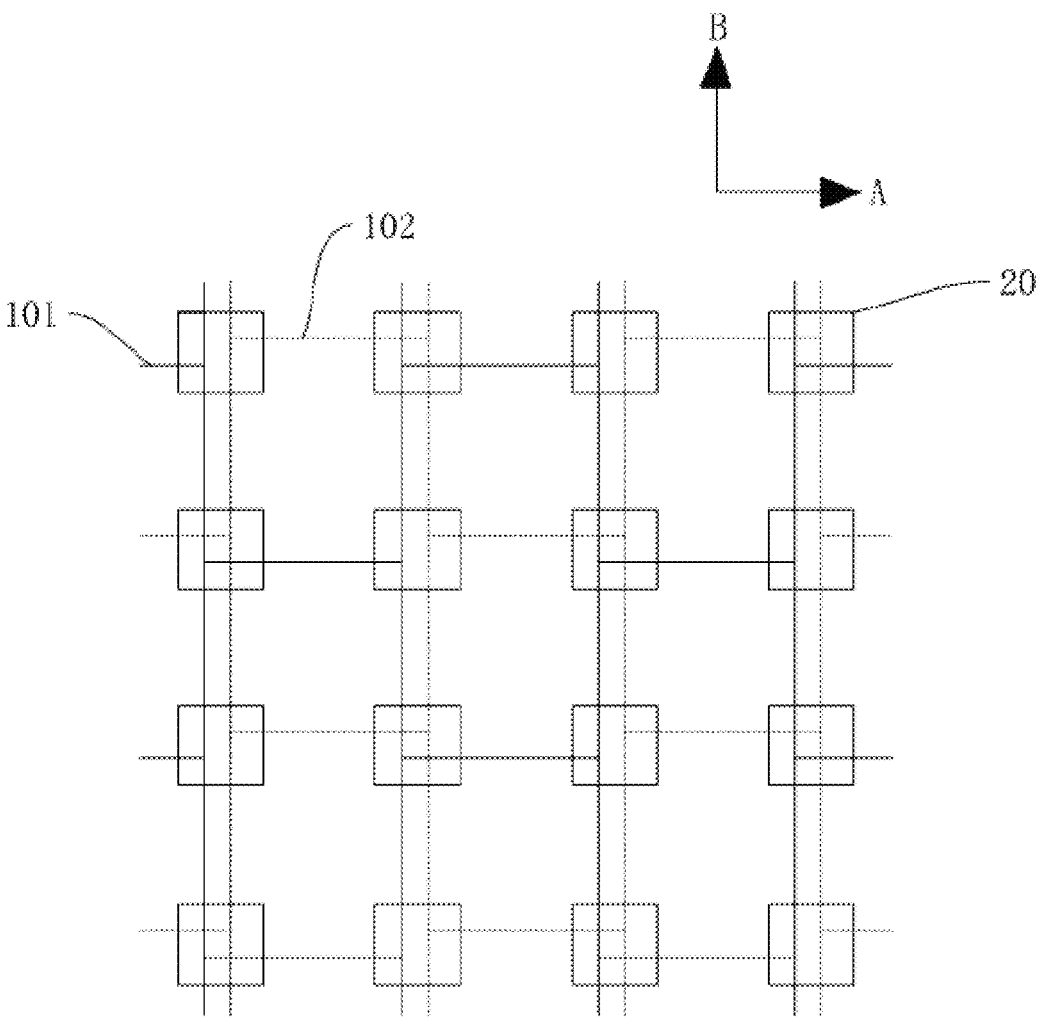
FIG. 1B is a schematic diagram of power line grid structure in a display panel provided by another embodiment of the present application.

In another embodiment of the present application, referring to FIG. 1B and FIG. 2, its difference from the previous embodiments is that one of the first connection bridge 301 provided with only the first power line 101 and one of the first connection bridges 301 provided with only the second power line 102 are alternately arranged in the second direction B, that is, any adjacent ones of first connection bridges 301 along the second direction B are provided with different types of power lines thereon, which are the first power line 101 or the second power line 102.

In addition, in this embodiment, on the second connection bridge 302, the first power line 101 and the second power line 102 are arranged in the same manner, as can be seen from FIG. 1B, the first power line 101 are arranged on the left side, and the second power line 102 are arranged on the right side, wherein the first power lines 101 and the second power lines 102 intersect on a part of the pixel islands 20, and does not intersect on another part of the pixel islands 20. Specifically, when the first power lines 101 and the second power lines 102 intersect on the pixel islands 20, the grid of the first grid structure corresponding to the intersecting first power lines 101 and the grid of the second grid structure corresponding to the intersecting second power lines 102 have an overlapping part.

In this embodiment, one of the pixel islands 20 having the first power line 101 and the second power line 102 that intersect each other, and the pixel islands 20 each having the first power line 101 and the second power line 102 that intersect and the pixel islands 20 having the first power line 101 and the second power line 102 that do not intersect each other are alternately arranged in the first direction A; one of the pixel islands 20 each having the first power line 101 and the second power line 102 that intersect each other and one of the pixel islands 20 having the first power line 101 and the second power line 102 that do not intersect each other are alternately arranged in the second direction B.

The power line grid structure provided in this embodiment improves the display uniformity of the display panel, so that the number of power lines arranged along the first direction A on the first connection bridge 301 is reduced by one, thereby reducing the width of the first connection bridge 301, and improving the stretching and bending performance of the first connection bridge 301, thus improving the stretching and bending performance of the display panel.

Figure 1C:
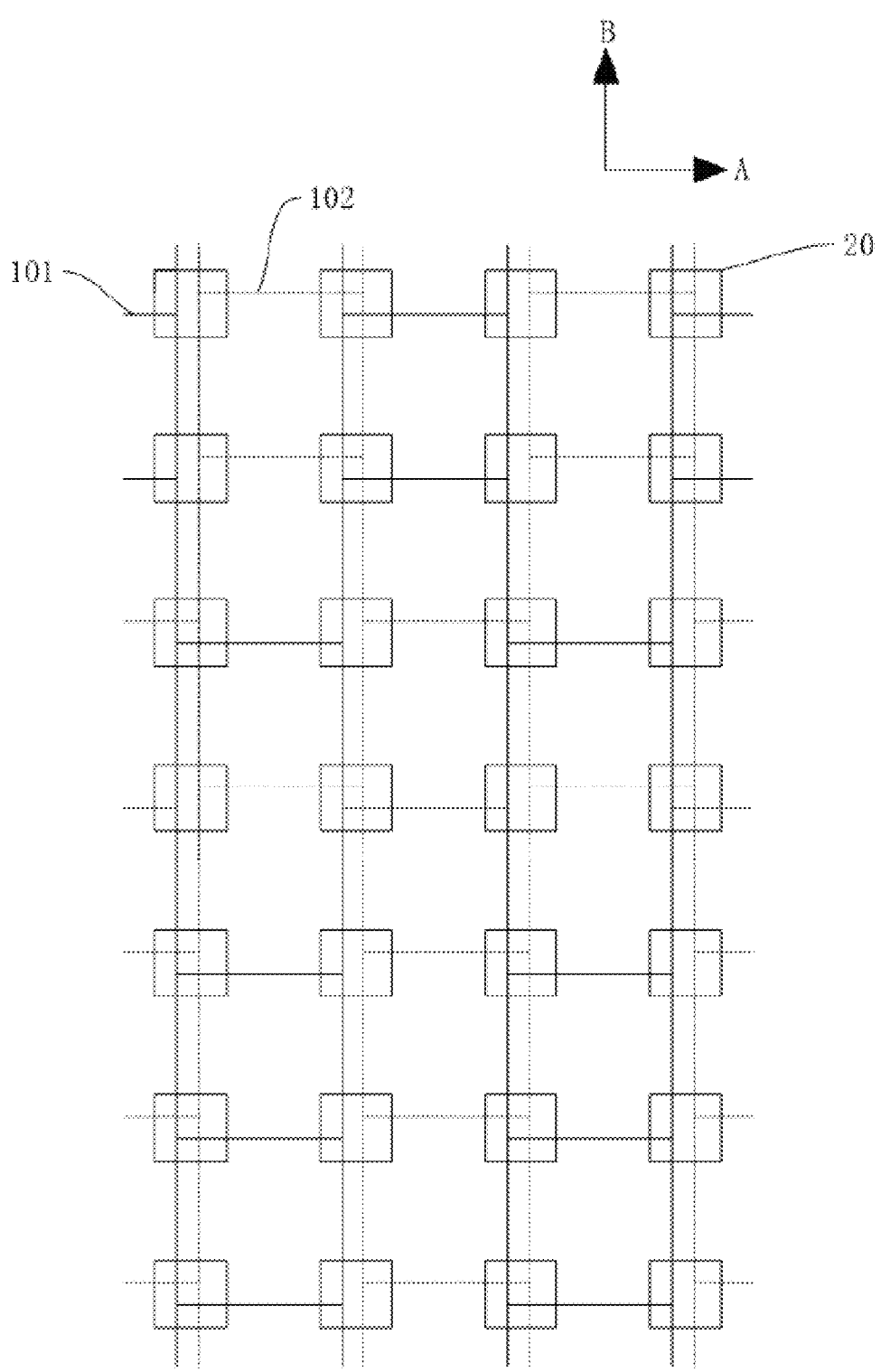
FIG. 1C is a schematic diagram of power line grid structure in a display panel provided by further another embodiment of the present application.

In another embodiment of the present application, Referring to FIG. 1C and FIG. 2, its difference from the previous embodiment is that the first connection bridges 301 each provided with only the first power line 101 and the first connection bridges 301 each provided with only the second power line 102 are alternately arranged irregularly in the second direction B, that is, the first connection bridges 301 each provided with only the first power line 101 and the first connection bridges 301 each provided with only the second power line 102 are alternately arranged in repetitions each having different numbers of ones, and there is no regularity. As shown in FIG. 1C, the manner includes from top to bottom: two first connection bridges 301 each provided with only the first power line 101, one first connection bridge 301 provided with only the second power line 102, one first connection bridge 301 provided with only the first power line 101, and three first connection bridges 301 each provided with only the second power line 102.

In addition, in this embodiment, on the second connection bridge 302, the first power line 101 and the second power line 102 are arranged in the same manner, as can be seen from FIG. 1C, the first power line 101 are arranged on the left side, and the second power line 102 are arranged on the right side, wherein the first power lines 101 and the second power lines 102 intersect on a part of the pixel islands 20, and does not intersect on another part of the pixel islands 20. Specifically, when the first power lines 101 and the second power lines 102 intersect on the pixel islands 20, the grid of the first grid structure corresponding to the intersecting first power lines 101 and the grid of the second grid structure corresponding to the intersecting second power lines 102 have an overlapping part.

In this embodiment, one of the pixel islands 20 having the first power line 101 and the second power line 102 that intersect each other, and the pixel islands 20 each having the first power line 101 and the second power line 102 that intersect and the pixel islands 20 each having the first power line 101 and the second power line 102 that do not intersect each other are alternately arranged in the first direction A; ones of the pixel islands 20 each having the first power line 101 and the second power line 102 that intersect each other and ones of the pixel islands 20 each having the first power line 101 and the second power line 102 that do not intersect each other are alternately arranged irregularly in the second direction B.

The power line grid structure provided in this embodiment improves the display uniformity of the display panel, so that the number of power lines arranged along the first direction A on the first connection bridge 301 is reduced by one, thereby reducing the width of the first connection bridge 301, and improving the stretching and bending performance of the first connection bridge 301, thus improving the stretching and bending performance of the display panel.

Figure 1D:
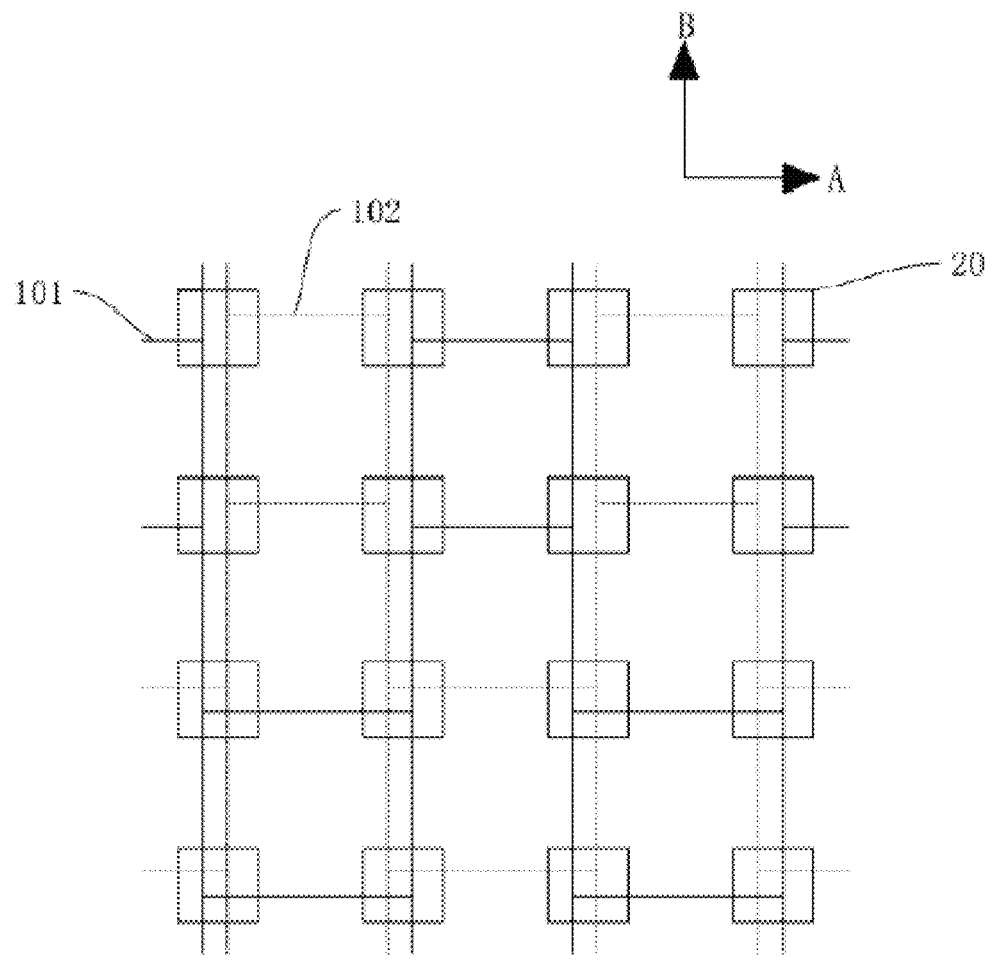
FIG. 1D is a schematic diagram of a power line grid structure in display panel provided by also another embodiment of the present application.

In another embodiment of the present application, referring to FIG. 1D and FIG. 2, its difference from the first embodiment is that, on the second connection bridge 302, the first power line 101 and the second power line 102 have different arrangements. It can be seen from FIG. 1D that the first power lines 101 and second power lines 102 on adjacent rows of the second connection bridges 302 arranged along the second direction B are symmetrically distributed, the first power lines 101 are arranged on the left side, the second power lines 102 are arranged on the right side, and the first power lines 101 are arranged on the right side, and the second power lines 102 on the left side.

The first power lines 101 and the second power lines 102 intersect on a part of the pixel islands 20, and does not intersect on another part of the pixel islands Specifically, when the first power lines 101 and the second power lines 102 intersect on the pixel islands 20, the grid of the first grid structure corresponding to the intersecting first power lines 101 and the grid of the second grid structure corresponding to the intersecting second power lines 102 have an overlapping part.

In addition, in this embodiment, each of the pixel islands 20 in the same row arranged along the first direction A has the first power line 101 and the second power line 102 that intersect each other, or has the first power line 101 and the second power line 102 that do not intersect each other. In addition, two of the pixel islands 20 each having the first power line 101 and the second power line 102 that intersect each other, and two of the pixel islands 20 each having the first power line 101 and the second power line 102 that do not intersect each other, are alternately arranged in the second direction B.

The power line grid structure provided in this embodiment improves the display uniformity of the display panel, so that the number of power lines arranged along the first direction A on the first connection bridge 301 is reduced by one, thereby reducing the width of the first connection bridge 301, and improving the stretching and bending performance of the first connection bridge 301, thus improving the stretching and bending performance of the display panel.

Figure 1E:
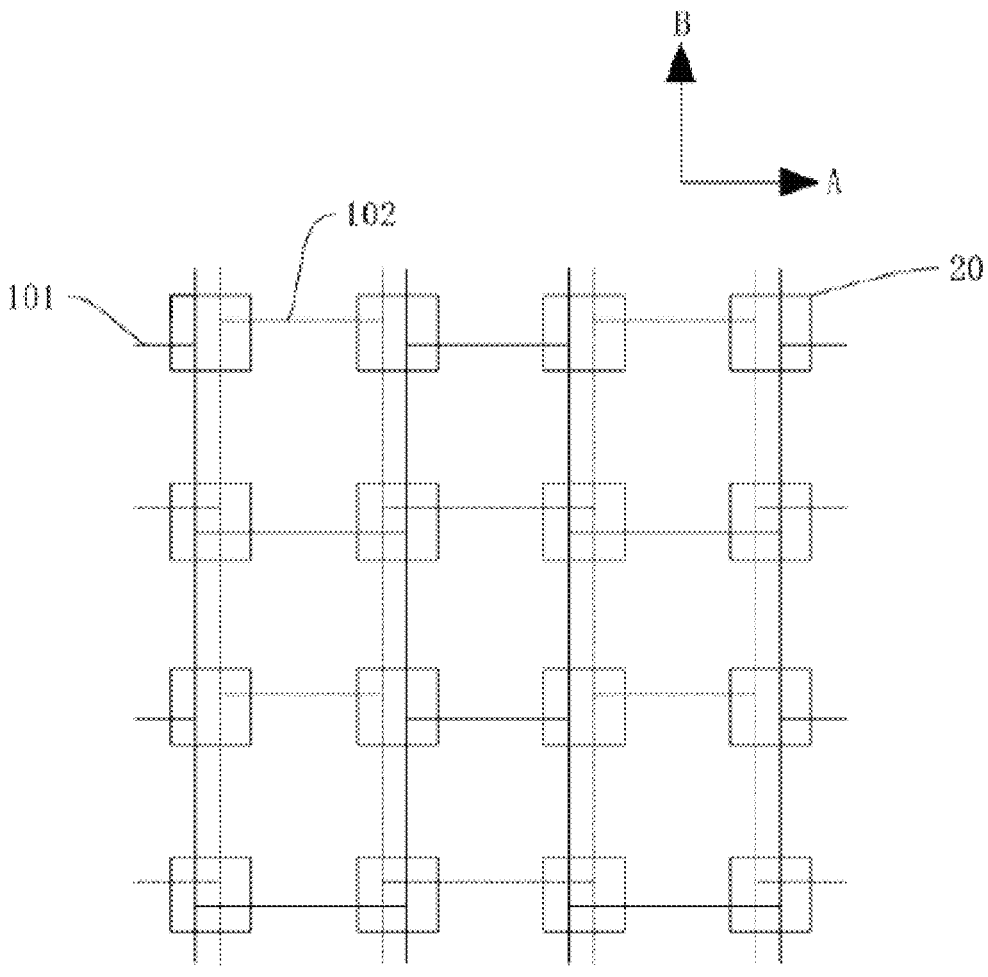
FIG. 1E is a schematic diagram of a power line grid structure in display panel provided by still another embodiment of the present application.

In another embodiment of the present application, referring to FIG. 1E and FIG. 2, its difference from the previous embodiment is that the first connection bridge 301 provided with only the first power line 101 and the first connection bridge 301 provided with only the second power line 102 are alternately arranged in the second direction B, that is, adjacent ones of the first connection bridge 301 in the second direction B are provided with different types of power lines, which are the first power line 101 or the second power line 102.

The first power lines 101 and the second power lines 102 intersect on a part of the pixel islands 20, and does not intersect on another part of the pixel islands 20. Specifically, when the first power lines 101 and the second power lines 102 intersect on the pixel islands 20, the grid of the first grid structure corresponding to the intersecting first power lines 101 and the grid of the second grid structure corresponding to the intersecting second power lines 102 have an overlapping part.

In addition, in this embodiment, each of the pixel islands 20 in the same row arranged along the first direction A has the first power line 101 and the second power line 102 that intersect each other, or has the first power line 101 and the second power line 102 that do not intersect each other. In addition, one of the pixel islands 20 having the first power line 101 and the second power line 102 that intersect each other, and one of the pixel islands 20 having the first power line 101 and the second power line 102 that do not intersect each other, are alternately arranged in the second direction B.

The power line grid structure provided in this embodiment improves the display uniformity of the display panel, so that the number of power lines arranged along the first direction A on the first connection bridge 301 is reduced by one, thereby reducing the width of the first connection bridge 301, and improving the stretching and bending performance of the first connection bridge 301, thus improving the stretching and bending performance of the display panel.

Figure 1F:
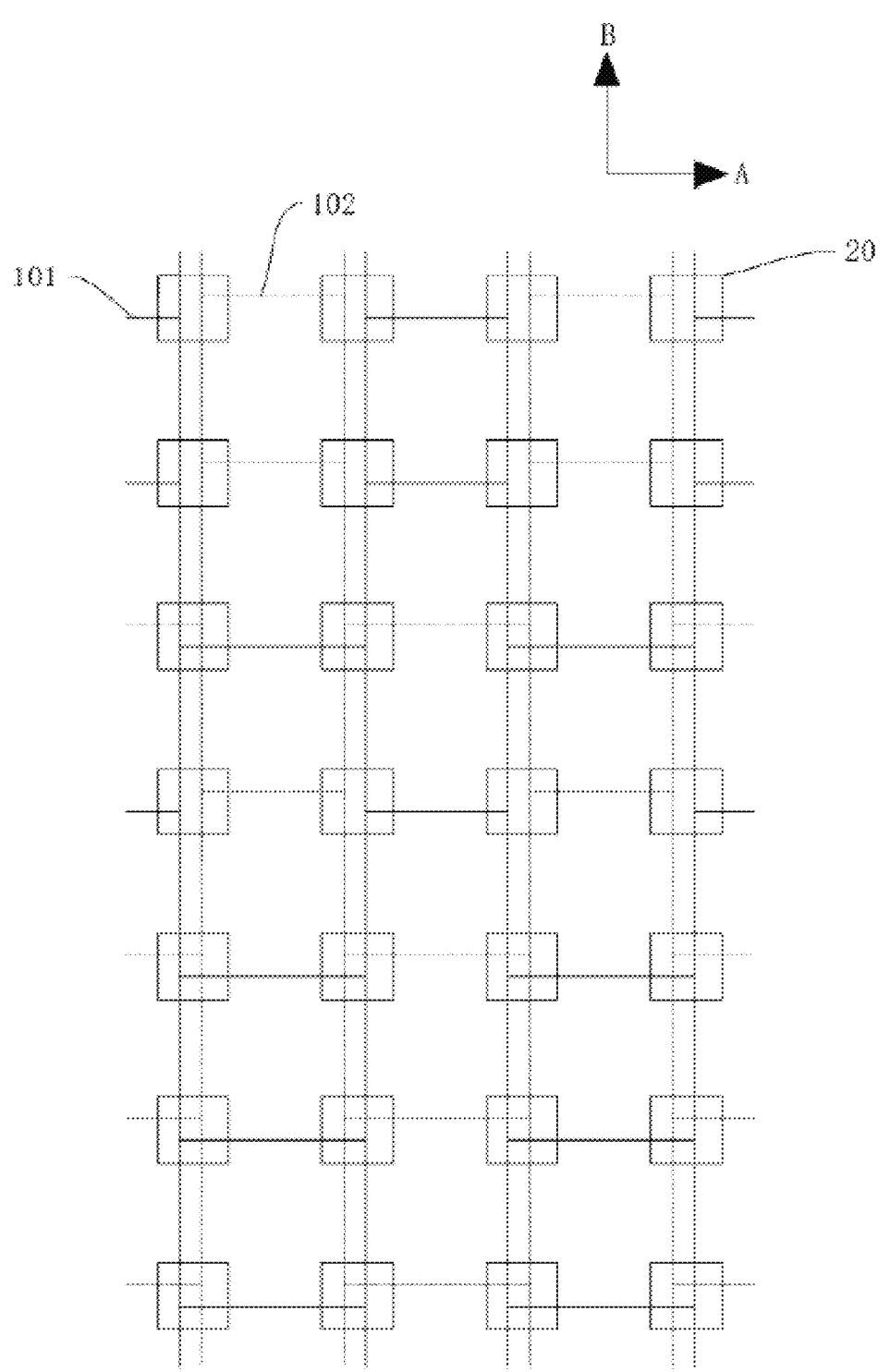
FIG. 1F is a schematic diagram of power line grid structure in a display panel provided by another embodiment of the present application.

In another embodiment of the present application, referring to FIG. 1F and FIG. 2, its difference from the previous embodiment is that ones of the first connection bridges 301 each provided with only the first power line 101 and ones of the first connection bridges 301 each provided with only the second power line 102 are alternately arranged irregularly in the second direction B, that is, the first connection bridges 301 each provided with only the first power line 101 and the first connection bridges 301 each provided with only the second power line 102 are alternately arranged in repetitions each having different numbers of ones, and there is no regularity. As can be seen from FIG. 1F, the manner includes from top to bottom: two first connection bridges 301 each provided with only the first power line 101, one first connection bridge 301 provided with only the second power line 102, one first connection bridge 301 provided with only the first power line 101, and three first connection bridges 301 each provided with only the second power line 102.

The first power lines 101 and the second power lines 102 intersect on a part of the pixel islands 20, and does not intersect on another part of the pixel islands Specifically, when the first power lines 101 and the second power lines 102 intersect on the pixel islands 20, the grid of the first grid structure corresponding to the intersecting first power lines 101 and the grid of the second grid structure corresponding to the intersecting second power lines 102 have an overlapping part.

In addition, in this embodiment, each of the pixel islands 20 in the same row arranged along the first direction A has the first power line 101 and the second power line 102 that intersect each other, or has the first power line 101 and the second power line 102 that do not intersect each other. In addition, ones of the pixel islands each having the first power line 101 and the second power line 102 that intersect each other, and ones of the pixel islands 20 each having the first power line 101 and the second power line 102 that do not intersect each other, are alternately arranged irregularly in the second direction B. It can be seen from FIG. 1F that, the manner includes from top to bottom: two of the pixel islands 20 having the first power line 101 and the second power line 102 that do not intersect each other, one of the pixel islands 20 having the first power line 101 and the second power line 102 that intersect each other, one of the pixel islands 20 of the first power line 101 and the second power line 102 that intersect each other, and three of the pixel islands 20 each having the first power line 101 and the second power line 102 that intersect each other.

The power line grid structure provided in this embodiment improves the display uniformity of the display panel, so that the number of power lines arranged along the first direction A on the first connection bridge 301 is reduced by one, thereby reducing the width of the first connection bridge 301, and improving the stretching and bending performance of the first connection bridge 301, thus improving the stretching and bending performance of the display panel.

Figure 1G:
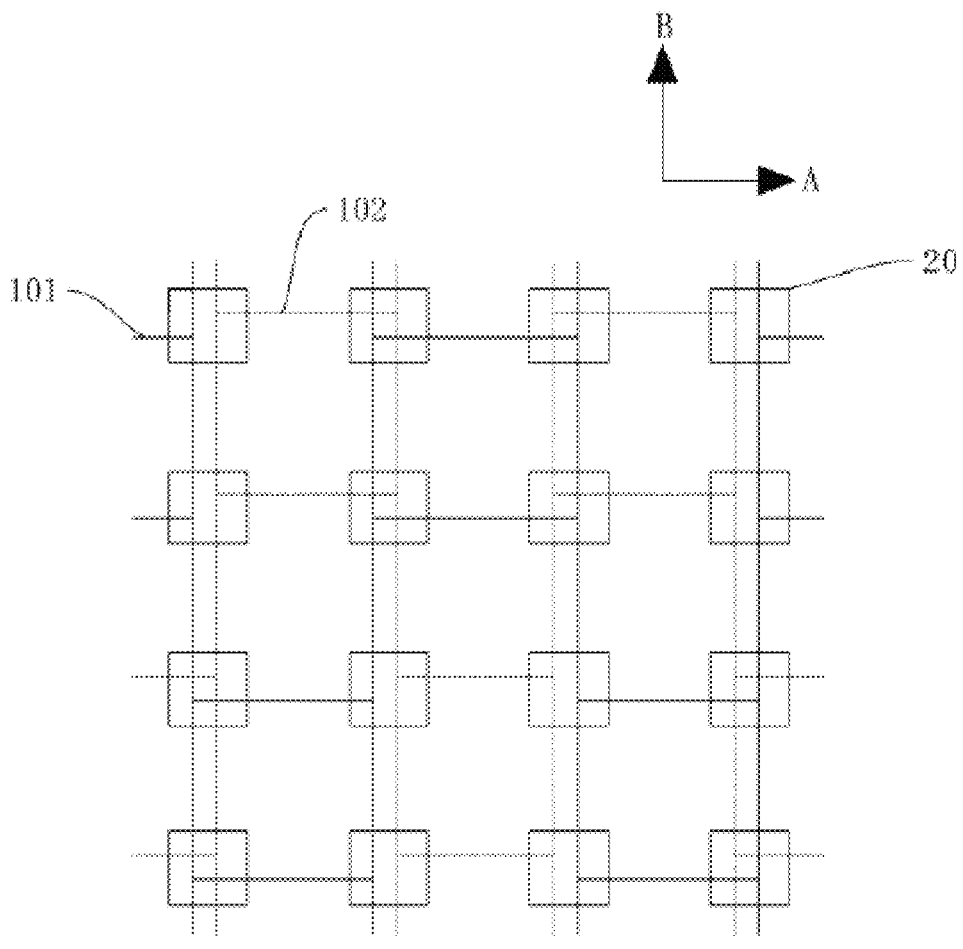
FIG. 1G is a schematic diagram of power line grid structure in a display panel provided by another embodiment of the present application.

In another embodiment of the present application, referring to FIG. 1G and FIG. 2, its difference from the first embodiment is that, on the second connection bridge 302, the first power line 101 and the second power line 102 have different arrangements. It can be seen from FIG. 1G that adjacent ones of the rows of the second connection bridges 302 arranged along the second direction B form a group, and the first power line 101 and the second power line 102 on each group of the second connection bridge 302 have the same arrangement; the first power line 101 and the second power line 102 on the adjacent ones of the groups of the second connection bridges 302 have opposite arrangements, wherein the first power lines 101 are arranged on the left side, and the second power lines 102 are arranged on the right side; or the first power lines 101 are arranged on the right, and the second power lines 102 are arranged on the left.

The first power lines 101 and the second power lines 102 intersect on a part of the pixel islands 20, and does not intersect on another part of the pixel islands Specifically, when the first power lines 101 and the second power lines 102 intersect on the pixel islands 20, the grid of the first grid structure corresponding to the intersecting first power lines 101 and the grid of the second grid structure corresponding to the intersecting second power lines 102 have an overlapping part.

Furthermore, in this embodiment, two of the pixel islands 20 each having the first power line 101 and the second power line 102 that intersect each other, and two of the pixel islands 20 each having the first power line 101 and the second power line 102 that do not intersect each other, are alternately arranged in the first direction A; in addition, two of the pixel islands 20 each having the first power line 101 and the second power line 102 that do not intersect each other, are alternately arranged in the second direction B.

The power line grid structure provided in this embodiment improves the display uniformity of the display panel, so that the number of power lines arranged along the first direction A on the first connection bridge 301 is reduced by one, thereby reducing the width of the first connection bridge 301, and improving the stretching and bending performance of the first connection bridge 301, thus improving the stretching and bending performance of the display panel.

It should be noted that in the foregoing embodiments, only a part of the power line grid structures is listed for illustration, but the present application is not particularly limited thereto. In the foregoing embodiments, the first connection bridges 301 each only provide with the first power line 101 and the first connection bridges 301 each only provided with the second power line 102 can be arranged in repetitions each by gradually increased or decreased numbers of ones, and the first power lines 101 and the second power lines 102 on the second connection bridges 302 can be arranged regularly or irregularly, that is, a power line grid structure which can be derived from the power line grid structure in the above embodiments and the description fall within the protection scope of the present application.

Figure 3:
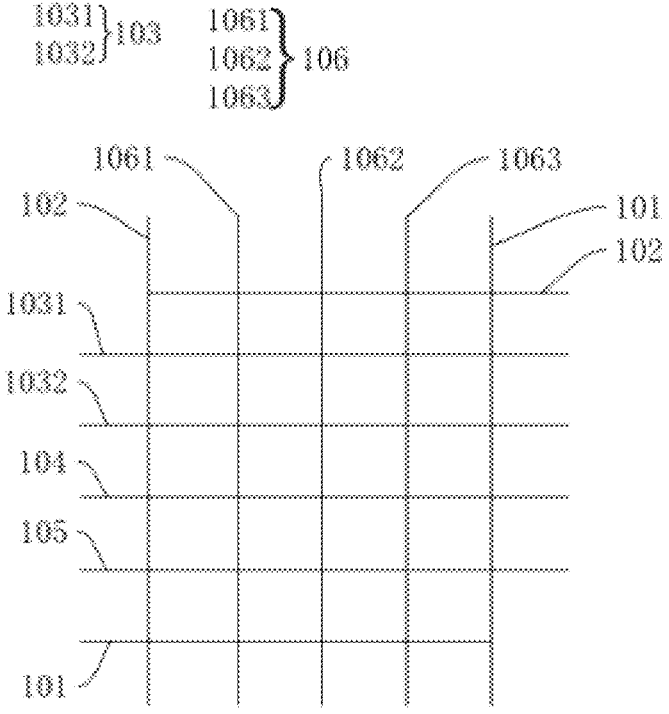
FIG. 3 is a schematic diagram of a signal line group arrangement structure in pixel islands provided by an embodiment of the present application.

Furthermore, referring to FIG. 1A, FIG. 2 and FIG. 3, each of the pixel islands 20 is provided with a pixel unit, wherein FIG. 3 is a schematic diagram of a signal line group arrangement structure corresponding to the pixel islands provided by an embodiment of the present application, it only shows the arrangement direction of the signal line group instead of showing the specific pixel circuit connection structure, and embodiments of the present application do not particularly limit the pixel circuit structure applied thereto.

It should be noted that, in an embodiment of the present application, the first power line 101 may be a VDD power signal line, the second power line 102 may be a VSS power signal line, and the signal line group may also include a first scan line 1031, a second scan line 1032, a light-emitting control signal line 104, a reset signal line 105, a first data line 1061, a second data line 1062, and a third data line 1063, wherein the pixel unit may include three sub-pixels to correspond to the first data line 1061, the second data line 1062, and the third data line 1063, respectively. In a pixel unit, the first scan line 1031 can transmit the scan signal of the current row, the second scan line 1032 can transmit the scan signal of the previous row, and the first data line 1061, the second data line 1062, and the third data line 1063 can transmit data signals.

Figure 6:
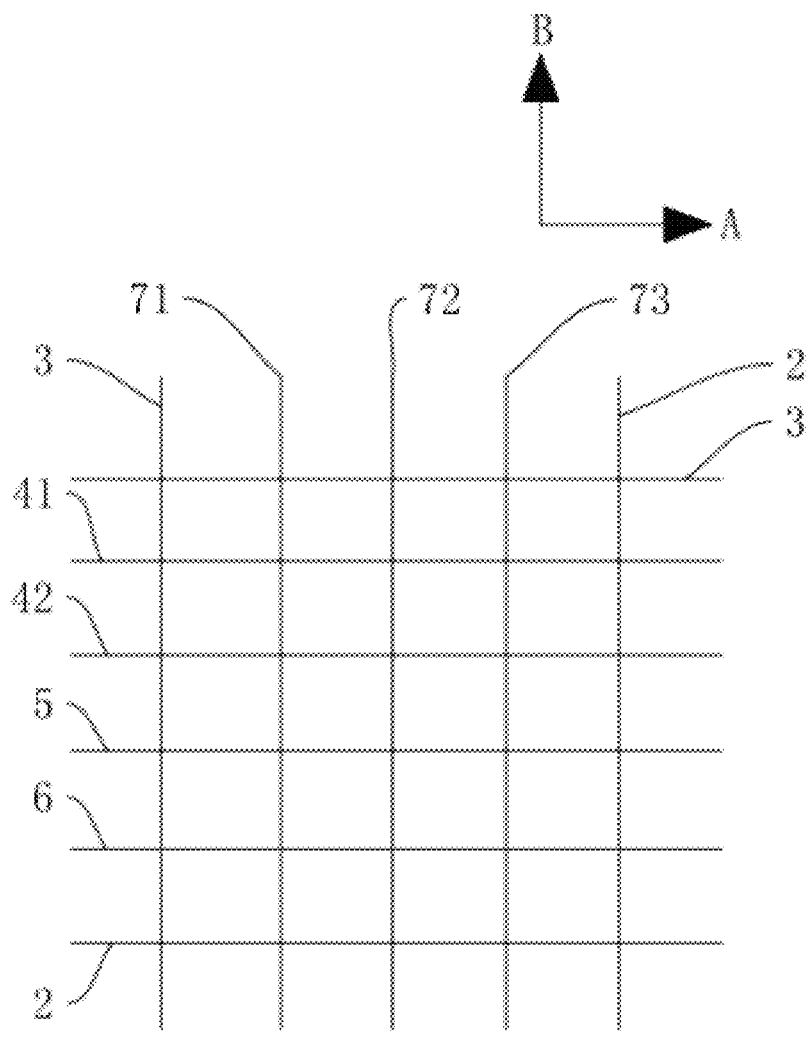
FIG. 6 is a schematic diagram of the arrangement structure of signal line groups in conventional pixel islands.

Referring to FIG. 5 and FIG. 6, which show the existing arrangement structure design of the pixel unit signal line group and the arrangement design of the power lines on the connection bridges, wherein the VDD power line 2, the VSS power line 3, the first scan line 41, the second scan line 42, the light-emitting control signal line 5, and the reset signal line 6 are arranged in the same direction, and extend along the first direction A to the connection bridge. The VDD power line 2, the VSS power line 3, the first data line 71, the second data line 72, and the third data line 73 are arranged in another direction and extend along the second direction B to the connection bridge. That is, on the connection bridge, the signal line group arranged along the first direction A has 6 lines, and the signal line group arranged along the second direction B has 5 lines. Therefore, a number of the power lines arranged in the first direction A is increased by one, thereby increasing the width of the connection bridges arranged in the first direction A, and limiting the stretching and bending performance of the connection bridges arranged in the first direction A.

Still referring to FIG. 1A, FIG. 2 and FIG. 3, in an embodiment of the present application, in each of the pixel islands 20, the first power line 101, the second power line 102, the first scan line 1031, the second scan line 1032, the light-emitting control signal line 104, and the reset signal line 105 are arranged along a third direction; and the first power line 101, the second power line 102, the first data line 1061, the second data line 1062, and the third data line 1063 are arranged in a fourth direction. It should be noted that the third direction is the same direction as the first direction A, and the fourth direction is the same direction as the second direction B; or the third direction is the same direction as the second direction B, and the fourth direction is the same direction as the first direction A. Further, the first power line 101, the second power line 102, the first scan line 1031, the second scan line 1032, the light-emitting control signal line 104, and the reset signal line 105 extend along the first direction A to the first connection bridge 301; and the first power line 101, the second power line 102, the first data line 1061, the second data line 1062, and the third data line 1063 extend along the second direction B to the second connection bridge 302. In each of the pixel islands 20, the first power line 101 extends to the first connection bridge 301 in only one direction, and the second power line 102 extends to the first connection bridge in another direction 301, which is opposite to the extension direction of the first power lines 101, so that each of the first connection bridges 301 is provided with only one power line, that is, the signal line group provided on the first connection bridge 301 has 5 lines, which are reduced by one, compared with the prior art. As such, the display panel provided by the embodiment of the present application has a power line grid structure as shown in FIG. 1A, so that the signal line group arranged along the second direction B has 5 signal lines, and the signal line group arranged along the second direction B also has 5 signal lines, thereby reducing the number of signal lines of the signal line group on the first connection bridge 301 and reducing width of the first connection bridge 301, thus improving the tensile and bending performance. In addition, the embodiments of the present application only take the above-mentioned signal line group as an example for illustration, and adjustments can be made according to the type and number of the actual signal line groups during the implementation process.

Figure 4:
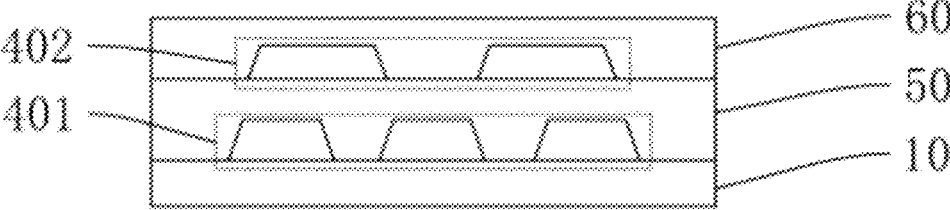
FIG. 4 is a schematic diagram of a cross-sectional structure of a connection bridge provided by an embodiment of the present application.

In addition, referring to FIG. 4, which is a schematic diagram of the cross-sectional structure of the connection bridge 30 provided by this embodiment of the present application, on the first connection bridge 301, due to the grid structure design of the power lines provided by the embodiment of the present application, the first connection bridge 301 is provided with 5 signal lines.

Specifically, each of the connection bridges 30 includes a substrate 10, a first conductive layer 401 disposed on the substrate 10, an insulating layer disposed on the substrate 10 and covering the first conductive layer 401 50, a second conductive layer 402 disposed on the insulating layer 50, and a functional layer 60 disposed on the insulating layer 402 and covering the second conductive layer 402, wherein the functional layer 60 may be a planarization layer, pixel definition layer, or so on.

In an embodiment of the present application, the first power line 101, the second power line 102, and the reset signal line 105 are located in the second conductive layer 402; and the light-emitting control signal line 104, the data line 106, and the scan line 103 are correspondingly located in the first conductive layer 401.

For the first connection bridge 301, the first conductive layer 401 includes the first scan line 1031, the second scan line 1032, the light-emitting control signal line 104, and the second conductive layer 402 includes the first power line 101 and the reset signal line 105, or the second power line 102 and the reset signal line 105. For the second connection bridge 302, the first conductive layer 401 includes the first data line 1061, the second data line 1062, and the third data line 1063, and the second conductive layer 402 includes the first power line 101 and the second power line 102.

The number of signal lines in the signal line group corresponding to the second conductive layer 402 is less than the number of signal lines in the signal line group corresponding to the first conductive layer 401, the most lines in the signal line group corresponds to the second conductive layer 402 are power lines, and the amount of current is relatively large, such that the width of the lines in the signal line group corresponding to the first conductive layer 401 is smaller than the width of the lines in the signal line group corresponding to the second conductive layer 402, but the present application is not particularly limited thereto. The width of each signal line in the signal line group can be set according to actual conditions. The present application only provides one embodiment for illustration.

In addition, referring to FIG. 2, in an embodiment of the present application, each or more of the plurality of connection bridges 30 are each arranged in a shape of one or more arc-curved segments between adjacent ones of the pixel islands 20. When the display panel is stretched or bent, the connection bridges 30 can be straightened or bent so that the display panel can be deformed, and the number of arc-curved segments of each of the connection bridges 30 can be the same or different, and the number of arc-curved segments can be set differently according to the corresponding deformation stress of the display panel, so as to improve the stretching and bending performance of the display panel.

Embodiments of the present application also provides a display device, and the display device includes the display panel described in the above-mentioned embodiment, wherein the structure of the display panel is the same as that described in the above-mentioned embodiment, and will not be repeated herein for brevity.

In the embodiments of the present application, by arranging a larger number of alternately connected first power lines and second power lines on the first connection bridges along the first direction, each of the first connection bridges is provided with only the first power line or the second power line, that is, provided with only one power line, so that the number of lines on the first connection bridge is reduced, thereby reducing the width of the first connection bridge, improving the stretchability of the connection bridge, and improving the stretching and bending performance of the display device. Meanwhile, the first power lines and the second power lines in an embodiment of the present application are connected to each other to form a grid structure, so that the signal transmission is more uniform, and the in-plane pressure drop of the display panel is reduced, thereby improving the display uniformity of the display device.

In the above embodiments, the descriptions of each embodiment have their own emphasis. The parts that are not described in detail in an embodiment can be referred to the detailed descriptions in other embodiments above, which will not be repeated herein for brevity.

The display panel and display device provided in the embodiments of the present application have been described in detail above. Specific examples are used in this document to explain the principles and implementation of the present invention. The descriptions of the above embodiments are only for understanding the method of the present invention and its core ideas, to help understand the technical solution of the present application and its core ideas, and a person of ordinary skill in the art should understand that it can still modify the technical solution described in the foregoing embodiments, or equivalently replace some of the technical features. Such modifications or replacements do not depart the spirit of the corresponding technical solutions beyond the scope of the technical solutions of the embodiments of the present application.

What is claimed is:

1. A display panel, comprising:
a plurality of pixel islands arranged along a first direction and a second direction which intersect each other;
a plurality of connection bridges, comprising first connection bridges connecting adjacent ones of the pixel islands arranged along the first direction and second connection bridges connecting adjacent ones of the pixel islands arranged along the second direction; and
a signal line group disposed on the plurality of connection bridges, wherein the signal line group comprises at least one of a first power line or a second power line, the first power line and the second power line being configured to provide power voltages, wherein only one of the first power line or the second power line is provided on each of the first connection bridges, and the one power line is connected to adjacent ones of the pixel islands along the first direction, and wherein both the first power line and the second power line are provided on each of the second connection bridges to connect adjacent ones of the pixel islands arranged along the second direction;
wherein, between any two adjacent ones of the first connection bridges along the first direction, one of the two adjacent first connection bridges is provided with the first power line and is not provided with the second power line, and the other of the two adjacent first connection bridges is provided with the second power line and is not provided with the first power line.

2. The display panel according to claim 1, wherein ones of the first connection bridges provided with only the first power line and ones of the first connection bridges provided with only the second power line are alternately arranged in the second direction.

3. The display panel according to claim 2, wherein two of the first connection bridges provided with only the first power line and two of the first connection bridges provided with only the second power line are alternately arranged in the second direction.

4. The display panel according to claim 1, wherein the first power line located on one of the first connection bridges is connected to the first power line located on one of the second connection bridges to form a first grid structure, and the second power line located on one of the first connection bridges is connected to the second power line located on one of the second connection bridges to form a second grid structure.

5. The display panel according to claim 4, wherein the first power line and the second power line intersect each other on part of the plurality of pixel islands, and a grid of the first grid structure corresponding to the intersecting first power line and a grid of the second grid structure corresponding to the intersecting second power line have an overlapping portion.

6. The display panel according to claim 1, wherein the signal line group further comprises a reset signal line, a light-emitting control signal line, a data line, and a scan line; and wherein the reset signal line, the light-emitting control signal line, and the scan line are provided on the first connection bridges to connect adjacent ones of the pixel islands arranged along the first direction, and the data line is disposed on the second connection bridges to connect adjacent ones of the pixel islands arranged along the second direction.

7. The display panel according to claim 6, wherein each of the plurality of connection bridges comprises a substrate, and a first conductive layer, an insulating layer, and a second conductive layer sequentially disposed on the substrate, the first power line, the second power line, and the reset signal line are disposed in the second conductive layer; and the light-emitting control signal line, the data line, and the scan line are disposed in the first conductive layer.

8. The display panel according to claim 1, wherein the first power line comprises a VDD power supply signal line, and the second power line comprises a VSS power supply signal line.

9. A display device, comprising a display panel, wherein the display panel comprises:

a plurality of pixel islands arranged along a first direction and a second direction which intersect each other;

a plurality of connection bridges, comprising first connection bridges connecting adjacent ones of the pixel islands arranged along the first direction and second connection bridges connecting adjacent ones of the pixel islands arranged along the second direction; and a signal line group disposed on the plurality of connection bridges, wherein the signal line group comprises at least one of a first power line or a second power line, the first power line and the second power line being configured to provide power voltages, wherein only one of the first power line or the second power line is provided on each of the first connection bridges, and the one power line is connected to adjacent ones of the pixel islands along the first direction, and wherein both the first power line and the second power line are provided on each of the second connection bridges to connect adjacent ones of the pixel islands arranged along the second direction;

wherein, between any two adjacent ones of the first connection bridges along the second direction, one of the two adjacent first connection bridges is provided with the first power line and is not provided with the second power line, and the other of the two adjacent first connection bridges is provided with the second power line and is not provided with the first power line.

10. The display device according to claim 9, wherein one of the first connection bridges provided with only the first power line and one of the first connection bridges provided with only the second power line are alternately arranged in the first direction.

11. The display device according to claim 9, two of the first connection bridges provided with only the first power line and two of the first connection bridges provided with only the second power line are alternately arranged in the second direction.

12. The display device according to claim 9, wherein the first power line located on one of the first connection bridges is connected to the first power line located on one of the second connection bridges to form a first grid structure, and the second power line located on one of the first connection bridges is connected to the second power line located on one of the second connection bridges to form a second grid structure.

13. The display device according to claim 12, wherein the first power line and the second power line intersect each other on part of the plurality of pixel islands, and a grid of the first grid structure corresponding to the intersecting first power line and a grid of the second grid structure corresponding to the intersecting second power line have an overlapping portion.

14. The display device according to claim 9, wherein the signal line group further comprises a reset signal line, a light-emitting control signal line, a data line, and a scan line; and wherein, the reset signal line, the light-emitting control signal line, and the scan line are provided on the first connection bridge to connect adjacent ones of the pixel islands arranged along the first direction, and the data line is disposed on the second connection bridge to connect adjacent ones of the pixel islands arranged along the second direction.

15. The display device according to claim 14, wherein each of the plurality of connection bridges comprises a substrate, and a first conductive layer, an insulating layer, and a second conductive layer sequentially disposed on the substrate; the first power line, the second power line, and the reset signal line are disposed in the second conductive layer; and the light-emitting control signal line, the data line, and the scan line are disposed in the first conductive layer.

16. The display device according to claim 9, wherein the first power line comprises a VDD power supply signal line, and the second power line comprises a VSS power supply signal line.

* * * * *